United States Patent
Kajiyama et al.

(10) Patent No.: US 8,425,875 B2
(45) Date of Patent: Apr. 23, 2013

(54) LITHIUM NIOBATE SAW WAFER CONTAINING TA IMPURITIES

(75) Inventors: Maria Claudia Custodio Kajiyama, San Jose, CA (US); Dieter Hans Jundt, Palo Alto, CA (US); Stephane Chamaly, Singapore (SG)

(73) Assignee: Crystal Technology, Inc., Palo Alto, CA (US)

( * ) Notice: Subject to any disclaimer, the term of this patent is extended or adjusted under 35 U.S.C. 154(b) by 0 days.

(21) Appl. No.: 12/869,883

(22) Filed: Aug. 27, 2010

(65) Prior Publication Data

US 2011/0059007 A1    Mar. 10, 2011

Related U.S. Application Data

(60) Provisional application No. 61/240,821, filed on Sep. 9, 2009.

(51) Int. Cl.
*C01G 33/00* (2006.01)
*C01D 15/00* (2006.01)

(52) U.S. Cl.
USPC .................. 423/594.8; 423/179.5

(58) Field of Classification Search .............. 29/25.35
See application file for complete search history.

(56) References Cited

U.S. PATENT DOCUMENTS 4,019,074 A * 4/1977 Shibayama et al. ...... 310/313 A
5,310,448 A * 5/1994 Bordui et al. .............. 423/594.8
5,482,001 A * 1/1996 Katoono et al. ................ 117/4

OTHER PUBLICATIONS

Wong, K.K, "Properties of Lithium Niobate," 2002, The Institution of Electrical Engineers, pp. 25-27.*
Kuz'minov, "Lithium Niobate Crystals: Physico-chemical Apects of Technology," 1999, Cambridge International Science Publishing, pp. 33, 34, and 80-85.*
Sichuan, "Niobium Pentoxide," Retrieved Aug. 1, 2012, retrieved from http://lasc.en.alibaba.com/product/478257144-213275195/Niobium_pentoxide.html.*
D. H. Jundt, "Niobium Compounds in Acoustics and Electro-Optics", http://www.cbmm.com.br/portug/sources/techlib/science_techno/table_content/sub_3/images/pdfs/020.pdf, Jul. 16, 2003, (pp. 4-5).
L. D. Cunningham, "Columbium (Niobium) and Tantalum", http://minerals.usgs.gov/minerals/pubs/commodity/niobium/niobimyb03.pdf, Aug. 15, 2006, (pp. 20.4).
Kushibiki et al, "Ultrasonic microscopy of congruent LiNbO3 crystals", Journal of Applied Physics, 98, 123507 2005, Jan. 9, 2006, (pp. 4).

(Continued)

*Primary Examiner* — Steven Bos
*Assistant Examiner* — Justin Bova
(74) *Attorney, Agent, or Firm* — Paul Davis; Goodwin Procter LLP

(57) ABSTRACT

The low Ta impurity content in pyrochlore ore makes it unnecessary to use a solvent extraction process to separate Nb from Ta. Consequently, niobium pentoxide powders using this ore can be produced at lower cost than competing mining/refining approaches, but in turn contain significant amounts of Ta impurities. SAW wafers are grown from melts produced by reacting niobium pentoxide powders containing Ta impurities at levels of 200 ppm or more by weight. Given proper amounts of starting powders, crystals can be grown with good yields and reproducible properties that satisfy typical SAW wafer specifications. The consistency across various lots of powders may be further improved by adding an appropriate amount of Ta pentoxide to the starting powders.

8 Claims, 10 Drawing Sheets

OTHER PUBLICATIONS

Kushibiki et al, "Evaluation and Selection of LiNbO3 and LiTaO3 Substrates for SAW Devices by the LFB Ultrasonic Material Characterization System", ieee transactions on ultrasonics, ferroelectrics, and frequency control, vol. 47, No. 4, Jul. 2000, Mar. 29, 2001, (pp. 1070-1071).

Bordui, et al., Compositional uniformity in growth and poling of large-diameter lithium niobate crystals, Journal of Crystal Growth 113 (1991) 61-68.

* cited by examiner

LITHIUM NIOBATE SAW WAFER CONTAINING TA IMPURITIES

CROSS-REFERENCE TO RELATED APPLICATIONS

The application claims the benefit of U.S. Provisional Application No. 61/240,821, filed Sep. 9, 2009 which is incorporated herein by reference in its entirety.

BACKGROUND

1. Field of the Invention

The present invention relates generally to the lithium niobate substrates, and more particularly to a lower cost surface acoustic wave (SAW) substrate made from lithium niobate grown from a raw material containing Ta (Ta) impurities.

2. Description of the Related Art

Niobium pentoxide ($Nb_2O_5$) powder prices are a substantial part of the raw material cost for LN. Existing suppliers of $Nb_2O_5$ powders for crystal growth typically refine this powder from columbite/tantalite concentrate. The ore is mostly mined in Australia and central Africa. Most refiners today are dissolving the concentrate in HF, the refractory fluorides are then dissolved in an organic solution, and a solvent extraction process is used for separating Nb from Ta. An alternative distillation process to separate these metals is used in the chlorination process, typically less economic for columbite/tantalite concentrate. (Eckert, Reichert et al. in Niobium, proceedings of the international symposium Niobium 2001, p 67, 2001).

Because of the demand for high purity Ta in capacitor manufacturing, the $Nb_2O_5$ can be produced as a byproduct of the liquid extraction process mainly geared towards Ta production. With modest demand for Nb metal or $Nb_2O_5$ powders, the supply used to exceed the demand and price levels were reasonably low. More recently, the demand for high purity $Nb_2O_5$ powder has increased, mostly because of applications in optical lens manufacturing phasing out lead containing glasses. This, together with possibly other market factors puts upward pressure on $Nb_2O_5$ powder prices.

Currently, $Nb_2O_5$ powders considered adequate for LN growth have purity ranging from 99.99% (4N) to 5N (Suzuki, T. (1995). "The elimination of defects in Czochralski grown lithium niobate." Journal of Materials Science 30(11): 2873-6). This enables pullout efficiencies of 85% or more (Bordui, P. F., R. G. Norwood, et al. (1991). "Compositional uniformity in growth and poling of large-diameter lithium niobate crystals." J. Crystal Growth 113: 61-68.) Assuming a powder at the low purity range (4N) and the only impurity occurring is Ta, then an estimate of an upper bound for Ta concentration of 100 ppm, as a worst case scenario for powders used in prior art growth of high quality lithium niobate, is made.

To reduce SAW wafer cost and decrease the price dependency on the current source of powders, lower cost alternatives for the niobium used for high volume LN growth is needed. Cost however is not the only criterion. The SAW properties need to be well controlled to satisfy the stability requirements of the SAW device manufacturers, and the grown crystals need to have adequate melt fraction conversion to make good use of the growth equipment. Center frequency stability, directly related to SAW velocity, is important for producing high yield in high performance SAW filters.

SUMMARY

An object of the present invention is to provide improved lithium niobate substrates.

Another object of the present invention is to provide lithium niobate substrates made from a crystal grown from a melt with a niobium pentoxide source material that contains Ta impurities.

A further object of the present invention is to provide lithium niobate substrates made from a crystal grown from a melt with a niobium pentoxide source material that contains Ta impurities at least 200 ppm by weight of Ta impurities.

Another object of the present invention is to provide lithium niobate substrates made from a crystal grown from a melt with a niobium pentoxide source material that contains Ta impurities to grow crystals of lithium niobate for SAW wafer production.

Still another object of the present invention is to provide lithium niobate substrates made from a crystal grown from a melt with a niobium pentoxide source material that contains Ta impurities where a ratio of niobium pentoxide powder to that of the lithium carbonate powder is controlled to keep SAW velocity variation along the grown crystal length within acceptable levels.

Yet another object of the present invention is to provide crystals of lithium niobate for SAW wafer production using powders of niobium pentoxide with Ta impurities of 400 ppm or more.

These and other objects of the present invention are provided in a lithium niobate substrate made from a crystal grown from a melt wherein the niobium pentoxide source material contains at least 200 ppm by weight of Ta impurities.

In another embodiment of the present invention, a lithium niobate substrate is provided that is made from a crystal grown from a melt with a niobium pentoxide source material that contains at least 400 ppm by weight of Ta impurities.

In another embodiment of the present invention, a lithium niobate substrate is made from a crystal grown from a melt reacted from source materials that includes a niobium pentoxide source material containing at least 200 ppm by weight of Ta impurities; a lithium carbonate source material; a Ta containing source material; and wherein an amount of Ta containing source material is chosen to ensure consistent Ta content in a starting melt composition.

In another embodiment of the present invention, a lithium niobate substrate is provide that is made from a crystal grown from a melt reacted from source materials that includes: a niobium pentoxide source material containing at least 400 ppm by weight of Ta impurities; a lithium carbonate source material; and a Ta containing source material, wherein an amount of Ta containing source material is chosen to ensure consistent Ta content in a starting melt composition.

DETAILED DESCRIPTION

Figure 1:
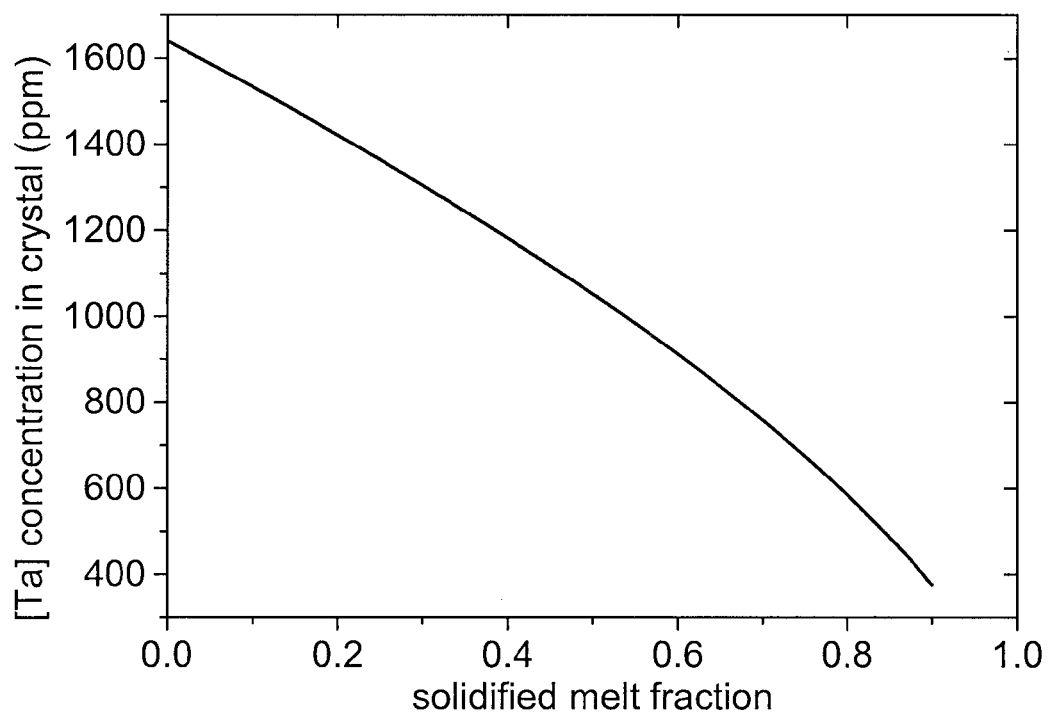
FIG. 1 is a graph that shows a simulation result for Ta incorporation into a lithium niobate crystal.

The world has substantial repositories of pyrochlore and some of them easily mined in open-pit mines (e.g. CBMM, Brazil). However, this ore has not traditionally been used for $Nb_2O_5$ (niobium pentoxide) production of high purity. The purification process of choice for this ore does not include the complex and costly fluorination with subsequent solvent extraction processes. Because of the chemical similarity of the refractory metals Nb and Ta, most refining processes do not significantly reduce the Ta content when producing $Nb_2O_5$ powders.

When assessing the amount of Ta impurities in the $Nb_2O_5$ starting material, it is customary to define this impurity concentration in ppm (parts per million) by weight. For a given amount of material, this number is defined as the weight of all contained Ta atoms divided by the total material weight, and then multiplied by one million. The pyrochlore concentrate can have varying amounts of Ta impurities depending on the ore deposit and the particulars of the refining process.

Concentrates typically range from, 55% to 65% of $Nb_2O_5$ containing from as low as 0.07% to as high as 0.29% of $Ta_2O_5$ impurities. (Issa Filho, A., Riffel, B. and Sousa, C. A. F. in "Some aspects of the mineralogy of CBMM niobium deposit and mining and Pyrochlore ore processing", proceedings of the international symposium Niobium 2001, p 53) Taking into account the molecular weights of the pentoxides and the Ta atoms, these oxide ratios translate into an impurity range for Ta ranging from 868 ppm to 4324 ppm.

Such amounts of Ta are generally acceptable for applications where this ore has traditionally been used (ferroniobium as additive to steel, optical powders for lens making). Concentrates made from other source material can have even lower Ta concentrations, e.g. 0.01% of $Ta_2O_5$ and 24.03% of $Nb_2O_5$ which corresponds to a Ta impurity concentration of 341 ppm. (Guimarães, H. N. and Weiss, R. A. in "The complexity of the niobium deposits in the alkaline-ultramafic intrusions Catalão I and II—Brazil", proceedings of the international symposium Niobium 2001, p 37) This amount of Ta however is generally considered too high to utilize the powders to grow single crystals of LN for SAW applications (T. Katoono, H. Tominaga, "Process for producing lithium niobate single crystal," (1996), U.S. Pat. No. 5,482,001), all incorporated herein by reference.

In one embodiment, the present invention uses $Nb_2O_5$ powders with Ta impurities for crystal growth while still satisfying the needs of the SAW user for a wafer with reproducible and well controlled SAW properties. Careful selection of starting ore and refining processes may result in $Nb_2O_5$ powders having, as a non-limiting example, Ta impurity contents as low as 200 ppm. In some embodiments, most powders are produced without the benefit of liquid extraction using a chlorination or fluorination process will have Ta impurity concentrations that can exceed 400 ppm. Both of those thresholds are significantly higher than what has traditionally been used for crystal growth, i.e. Ta impurity content clearly below 100 ppm.

In one embodiment of the present invention, a lithium niobate substrate is made from a crystal grown from a melt with a niobium pentoxide source material that contains at least 200 ppm by weight of Ta impurities.

In another embodiment of the present invention, a lithium niobate substrate is provided that is made from a crystal grown from a melt with a niobium pentoxide source material that contains at least 400 ppm by weight of Ta impurities.

In another embodiment of the present invention, a lithium niobate substrate is made from a crystal grown from a melt reacted from source materials that includes a niobium pentoxide source material containing at least 200 ppm by weight of Ta impurities; a lithium carbonate source material; a Ta containing source material; and wherein an amount of Ta containing source material is chosen to ensure consistent Ta content in a starting melt composition.

In another embodiment of the present invention, a lithium niobate substrate is provide that is made from a crystal grown from a melt reacted from source materials that includes: a niobium pentoxide source material containing at least 400 ppm by weight of Ta impurities; a lithium carbonate source material; and a Ta containing source material, wherein an amount of Ta containing source material is chosen to ensure consistent Ta content in a starting melt composition.

As a non-limiting example, Ta impurity concentrations by weight in the $Nb_2O_5$ powders can range from 200 ppm to 2000 ppm, or even higher, depending on the mineral ore and the refining processes applied, excluding highly efficient organic solvent extraction processes such as the one using MiBK or other solvents that may be utilized for segregating Nb from Ta by precipitation.

The challenges of using such powder for LN growth are three-fold, First, the Ta ions are incorporated at a rate different from the Nb metal ions. This leads to a segregation and change of crystal properties along the growth axis. The change in Ta concentration along the growth axis can be significant and also affect the [Li]/[Nb] ratio in the crystal, influencing the values of important crystal parameters. Second, the presence of Ta or other impurities in the starting powders may lead to segregation and constitutional supercooling. This can happen either by an impurity that accumulates directly in the melt, or indirectly if the Ta presence alters the [Li]/[Nb] incorporation and leads to off-congruent mixtures. To date, no model or experimental study has been published to shed light on the interaction of [Li]/[Nb] and Ta ions into the crystal. The third challenge is one of ensuring consistent SAW performance in light of varying [Ta]/[Nb] and [Li]/([Nb]+[Ta]) crystal compositions. No prior work studying the influence of Ta incorporation into the crystal and its influence on SAW properties has been done. It is demonstrated that lithium niobate crystals can be grown from powders containing a substantial amount of Ta impurities and yield wafers suitable for SAW filter As a non-limiting example, the following describes an approximate model that predicts how the Ta impurities affect the incorporation of the other ionic constituents into the crystal lattice. While this model makes specific predictions, these predictions depend on the model being a good approximation for what actually happens in the crystal, and also on the particular material constants assumed as model parameters. A number of variations to these assumptions can easily be imagined by those trained in the art and such changes to the model will influence the actual predictions for the incorporated concentrations of ions in the grown crystal.

The Ta ions get incorporated preferentially into the crystal as compared to the Nb ions (A. A. Ballman, H. Brown, P. K. Tien, and S. Riva-Sanseverino, "The growth of solid solution LiNbO$_3$—LiTaO$_3$ thin films for optical waveguides," (1975) Journal of Crystal Growth 30, pp. 37-41, and I. G. Wood, P. Daniels, R. H. Brown, A. M. Glazer, *JOURNAL OF PHYSICS: CONDENSED MATTER*. 2008, 20, 1-5). Lithium niobate and lithium tantalate have the same crystal structure and form a perfect solid solution (A. Räuber, "Chemistry and physics of lithium niobate," in Current topics in materials science, E. Kaldis, ed. (North-Holland, Amsterdam, 1978), pp. 481-601), all incorporated herein by reference.

Ta or Nb ions are incorporated predominantly onto the Nb site with a minority getting incorporated onto the Li site as anti-site defects. The [Ta]/[Nb] distribution coefficient does not depend strongly on the stoichiometry of the melt [Li]/([Li]+[Ta]+[Nb]) as this ratio only changes slightly from a congruent composition during the growths considered here. For example, CLN with [Li]/([Li]+[Nb])=48.38% has 10,000 ppm of anti-sites and lattice site vacancies on a similar order of magnitude.

If the Ta incorporation is affected by a small percentage change in these defects, it is a small influence, similar to that of Nb incorporation. It is assumed therefore, the [Ta]/[Nb] incorporation ratio is constant and independent of the exact [Li]/([Li]+[Ta]+[Nb]) or [Ta]/[Nb] ratio. This effective incorporation ratio is given by the slopes of the solidus/liquidus curves in the phase diagram at the [Ta]/[Nb]=0 boundary. The ratio of Ta to Nb ions for either melt or crystal is:

$$r=[Ta]/[Nb] \quad (1)$$

The effective distribution coefficient for Ta is:

$$k_{eff}=(r_{xtal}/r_{melt}) \quad (2)$$

and it is assumed to be a constant greater than one. It then follows that the axial Ta concentration along the crystal length follows the well-known Scheil-Pfann equation for a dopant where g is the melt fraction converted into crystal material at any stage during growth $$r_{xial}=r_{melt}(0) \times k_{eff}(1-g)^{k_{eff}-1}. \quad (3)$$

Knowing the Ta impurity concentration in the initial melt, equation (3) enables one calculate the Ta concentration along the crystal axis as well as the changing Ta concentration in the melt during growth. With the assumption of $k_{eff}>1$, equation (3) predicts that a crystal top has higher Ta content than the starting melt and a tail that contains less Ta impurities because the melt gets depleted of Ta. It is customary to express impurities in the starting powders in terms of ppm by mass. The quantity r in the starting melt is related to the ppm content of Ta metal in the Nb$_2$O$_5$ powder by using atomic mass values. These conversions can be applied to the melt or crystal of any composition by using the relationship $$Ta_{ppm} = 10^6 \times \frac{2 \cdot r \cdot M_{Ta}}{r \cdot M_{Ta2O5} + M_{Nb2O5}} \quad (4)$$

$$= 10^6 \times \frac{2 \cdot r \cdot 180.948}{r \cdot 441.893 + 265.810}$$

For the case where additional Ta is added to the melt other than what is contained in the niobium pentoxide powders, equation (4) needs to be modified, an operation straightforward to those trained in the art.

It is well known that lithium niobate of the congruent composition will have the same stoichiometry in the grown crystal as that of the melt. Deviations from congruency at x=48.38% will lead to a deviation of the value [Li]/[Nb] from that of the melt, and axial changes in the crystal as described in the publication by the inventors (Jundt, D. H., and Kajiyama, M. C. C., (2008) "Axial stoichiometry variations in lithium niobate crystals grown from near-congruent melts." J. Crystal Growth 310, pp. 4280-4285), incorporated herein in its entirety. The Ta ions in the melt compete with the Nb ions for lattice sites. Analogous to the stoichiometry definition in pure lithium niobate, the ratio is defined of lithium ions to the sum of the refractory metal ions for both melt and crystal compositions.

$$m=[Li]/([Nb]+[Ta]) \quad (5)$$

In a congruent LN crystal with zero Ta concentration, this ratio is $m_c=0.937234$. In the following, ion concentrations are discussed but the actual melt and crystal will consist of oxides or clusters of oxides. The derived relationships still hold as the oxygen lattice is assumed to have no vacancies. If it assumed that there are small amounts of Ta content in the melt, and adjust the Li content to have m=m$_c$. Because the Ta ions have a tendency to get incorporated into the crystal with $k_{eff}>1$, the value m for the crystal will be higher than that of the melt. The Ta$^{5+}$ ions will incorporate on lattice sites that Nb$^{5+}$ may also occupy, mostly the Nb site and to a much lesser degree, the Li site. Because the charge is the same, the incorporated Ta$^{5+}$ cations on a particular site will have the same effect as the Nb$^{5+}$ ions on the same site as far as ions in the melt looking to settle into the lattice are concerned. The overall effect therefore is that Ta incorporation will modify the effective Nb and Li incorporation into the crystal via the preferential incorporation of the Ta ions over the Nb ions.

To develop a quantitative model, the undoped LN growth relationship for the effective distribution coefficient for LN is as follows:

$$k_{Li2O} = 1 - 1.511 \times \frac{x_l - x_c}{100\%} \text{ where } m = \frac{x}{1-x} \text{ and } x = \frac{m}{1+m} \quad (6)$$

and the index l designates the liquid. An effective distribution coefficient can be defined that relates the m values rather than x for the melt and crystal, and use the correlation given in equation (6) to yield $$k_m \equiv \frac{m_s}{m_l} = 1 - 0.7808 \times (m_l - m_c). \quad (7)$$

The effect of Ta ions (r>0) on the Li incorporation can be estimated using this equation even though it was derived for undoped crystals. For simplicity, it can assumed that the relative distribution of incorporated Ta ions onto the Li sites and the Nb sites is the same as that for Nb ions. The model can be modified for more generalized assumptions. In a pure, congruent crystal with r=0, the rate at which a Li ion in the melt incorporates into the lattice is the same as that of a Nb ion. The $k_m$ value is one at congruency. A melt rich in lithium oxide will result in a $k_m$ value less than one, and the Li ions are incorporated at a corresponding lower rate (as compared to the refractory Nb ion incorporation). If a fraction of the refractory ions in the melt now are replaced with Ta ions, they will be incorporated more aggressively. The overall refractory ion incorporation rate is increased by the factor $(1-r)+r \times k_{eff}$, the first term describing the Nb ion incorporation the second the Ta ion incorporation. The effect of this increased refractory ion incorporation rate manifests itself as a decrease of the Li ion incorporation rate according to $$k_m \equiv \frac{m_s}{m_l} = \frac{1 - 0.7808 \times (m_l - m_c)}{1 + r(k_{eff} - 1)}. \quad (8)$$

Given the known evolution of r for [Ta]/[Nb] in the crystal, and equation (8) to describe the alkali vs. refractory ion incorporation into the crystal, the growth evolution can now be described by making use of the conservation of mass. The mass fraction of lithium oxide in the melt or crystal is given by $$\mu = \frac{[Li] \times M_{Li_2O}}{[Li] \times M_{Li_2O} + [Nb] \times M_{Nb_2O_5} + [Ta] \times M_{Ta_2O_5}} \approx \quad (9)$$
$$\approx \frac{[Li] \times M_{Li_2O}}{[Li] \times M_{Li_2O} + ([Nb] + [Ta])/(1 + r) \times M_{Nb_2O_5} + r \times ([Nb] + [Ta])/(1 + r) \times M_{Ta_2O_5}} =$$
$$= \frac{m \times M_{Li_2O}}{m \times M_{Li_2O} + 1/(1 + r) \times M_{Nb_2O_5} + r/(1 + r) \times M_{Ta_2O_5}}.$$

The parameter $M_{Li_2O}$ for the molecular weight of lithium oxide etc so equation (9) together with the known impurity content r gives a conversion between the mass fraction μ for lithium oxide and the alkali to refractory ion ratio m. Doing this conversion for both the melt and solid defines a mass distribution coefficient κ that follows the mass conservation equation $$\frac{\partial \mu_l}{\partial g} = \frac{1 - \kappa(\mu_l)}{1 - g} \times \mu_l. \quad (10)$$

Figure 2:
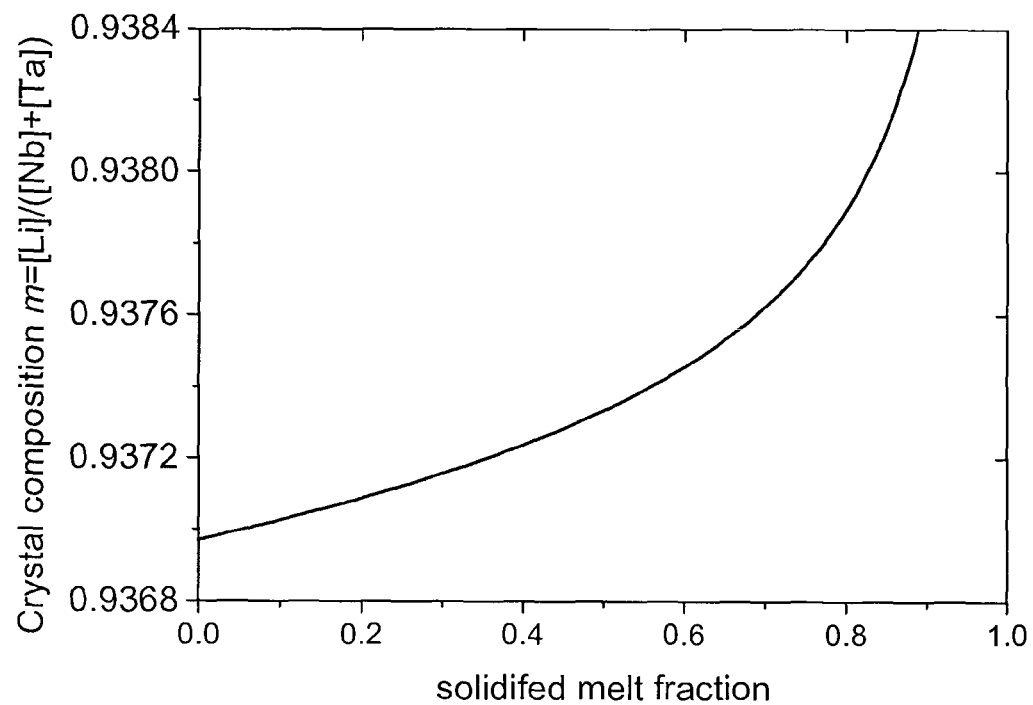
FIG. 2 is a graph that shows a simulation result for the alkali to refractory ion ratio along the grown lithium niobate crystal length.

Equations (3), (8)-(10) now can be used to model (integrate) the crystal growth of any starting melt, characterized by the two parameters r for the Ta content, and m for the alkali to refractory ion ratio. Equations (4), (6) and (9) are used to convert between the various conventions. As mentioned above, this model is an approximation of the actual incorporation rates. As the understanding improves of the precise mechanisms controlling the relative incorporation rates of Li, Nb, and Ta onto the two sites, the model can be modified by someone trained in the art to give more precise predictions. FIG. 1 shows a simulation result for Ta concentration in the crystal along its growth axis with assumed values 1000 ppm of Ta impurities in the starting melt (r=0.0375%), and a distribution coefficient $k_{eff}$=1.64. It can be seen that the concentration of Ta in the crystal is larger than the melt concentration at the beginning of the growth, in agreement with $k_{eff}$>1. As the growth progresses, this preferential Ta incorporation depletes the impurity in the melt, and the concentration of Ta incorporated into the crystal decreases along its growth axis. FIG. 2, in addition, assumes a starting melt composition value of m=0.9379, close to the congruent composition and shows the evolution of the crystal composition m along the growth axis. As described above, the presence of the Ta ions in the melt and their incorporation into the crystal affect the evolution of the composition parameter m.

Influence of Composition and Ta Inpurities on Crystal Properties

It is well known that deviations from congruency in LN influence the SAW velocity (Yamada, K., Tekemura, H., Inoue, Y., Omi, T., and Matsumura, S., (1987), "Effect of Li/Nb Ratio on the SAW Velocity of 128° Y-X LiNbO3 Wafers," Japanese Journal of Applied Physics 26-2, pp. 219-222). The free SAW velocity (no metallization of the surface) changes with the molar ratio x=[Li]/([Li]+[Nb]) according to $\partial v_f/\partial x$=43 (m/s)/mol %. Using equation (6), this number can be expressed as a function of the composition number m, resulting in a sensitivity value of $\partial y_f/\partial m$=1147 m/s. Prior work has also established a relationship between the composition of (Ta-free) LN crystals and the Curie temperature (P. F. Bordui, R. G. Norwood, D. H. Jundt, and M. M. Fejer, (1992) "Preparation and characterization of off-congruent lithium niobate crystals," J. Appl. Phys. 71(2), 875-879). Converting the relationship given in that reference with the help of equation (6) yields $\partial T_C/\partial m$=1041° C. For undoped LN therefore, the Curie temperature value can be used as a predictor for the free velocity variation, assuming that the variation in composition is the driving force affecting both crystal properties. The velocity change for every degree of Curie temperature change is $dv_f/dT_C$=(1147 m/s)/(1041 C)=1.10 m/s/° C. For the crystals considered here, Li/Nb change however is only one of the influences on SAW velocity.

The other contributor to a velocity change is the Ta content. As no measurements have been made to characterize the Ta concentration effect on the SAW velocity, it is necessary to estimate the influence based on first principle considerations, but keep in mind that this estimate may have large uncertainties. The free surface velocity for X-propagating Rayleigh SAW on 128RY can be modeled for both LN and LT based on material density, the piezoelectric and the stiffness tensors. For a 128° rotated Y cut, these calculations yield for the free SAW wave velocity $v_f(LN)$=3980 m/s and $v_f(LT)$=3460 m/s. The shift to lower velocity for LT is due to the larger mass of the Ta ions with the higher stiffness compensating for some of that shift. Vegard's law can be used to estimate the influence of small amounts of Ta ions on the velocities by a linear interpolation $$v_f \approx v_f(LN) + r(v_f(LT) - v_f(LN)). \quad (11)$$

The range of interest is the slope close to the LN composition where r is small. There are indications that the stiffness does not change linearly with r but has a quadratic component. Without more precise knowledge on these solid solutions, one can estimate the velocity rate with a change in r, $\partial v_f/\partial r$, to fall between −300 m/s and −1000 m/s.

Other crystal parameters used to characterize the material can also be expected to vary with both r and m. Examples for such parameters are the Curie temperature where the crystal undergoes a phase transition from ferroelectric to paraelectric material, or the lattice size constants. These parameters are of interest to the crystal grower because they provide a quicker characterization tool for crystal uniformity and consistency than building and characterizing SAW devices. It is customary to express the allowable crystal variations in terms of variations in Curie temperature (IEC standard 62276, Single crystal wafers for surface acoustic wave (SAW) device applications—Specifications and measuring methods). While the combined effect of variations in r and m has not been fully characterized, it is reasonable to assume that the effects of small deviations from a pure congruent crystal characterized by r=0 and m=$m_c$, can be added to predict the change of any parameter of interest. To estimate the sensitivity of the Curie temperature on the Ta content r, typical values for pure LN (1142.3° C.) and LT (605° C.) are recalled and the fact that the Curie temperature has been shown to be linear in the whole solid solution range (Ferroelectrics and related substances, subvolume a: Oxides," in Landolt-Börnstein, Zahlenwerte und Funktionen aus Naturwissenschaften und Technik, Neue Serie, K. H. Hellwege and A. M. Hellwege, eds. (Springer-Verlag, Berlin, 1981)). The dependence of Curie temperature on r is then given as $\partial T_C / \partial r = -537°$ C. Because the Ta concentration in the crystal is decreasing continuously along the growth axis, a deliberate deviation in the starting value of m from the value $m_c$ can be utilized to compensate for some of the effect of the Ta gradient on SAW velocity. That way, the top to bottom variation in important SAW parameters can be minimized for a given Ta impurity content in the starting melt. To keep this compensation predictable and consistent, the value of Ta impurity content in the starting melt needs to be consistent. If the powder supply changes, e.g. because a different ore is used, it may alter the Ta content from that previously used or approved by the wafer customers. In that case, it is possible to either adjust m to minimize the impact, or to purposely add Ta containing powders to bring the total Ta content of the melt to a consistent value that can be maintained for various different powder lots or sources. In the latter case, the target Ta concentration of the melt should be chosen such as to exceed the expected maximal Ta concentration contained in any of the niobium pentoxide powders considered.

Example 1

Figure 3:
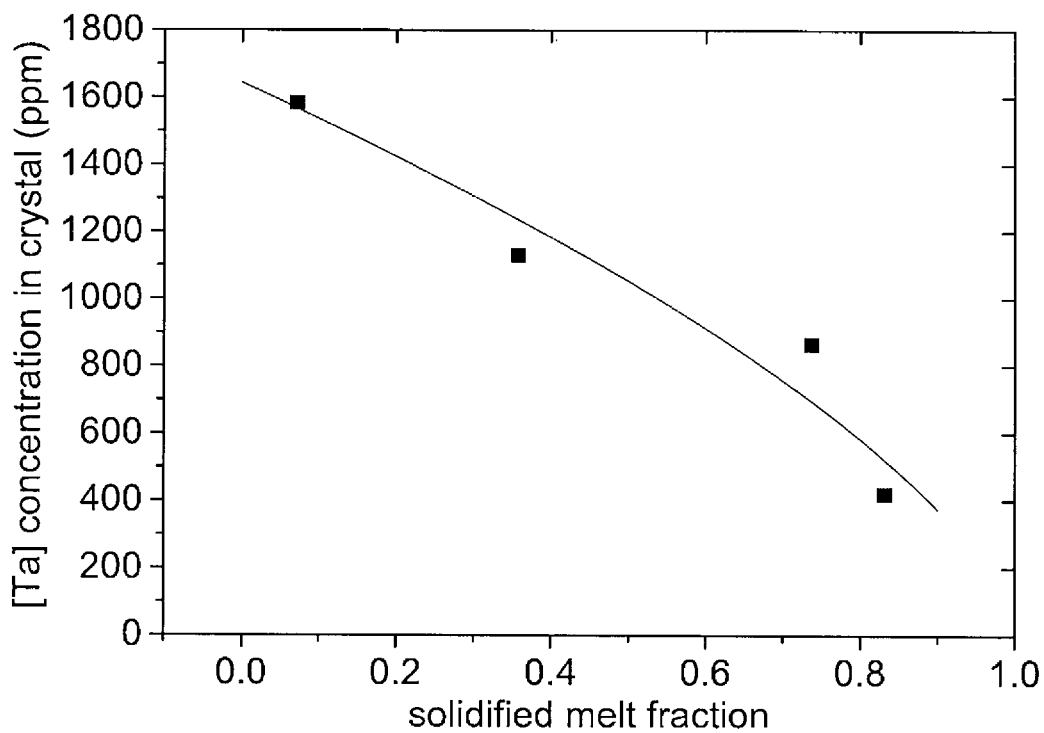
FIG. 3 is a graph that shows the measured Ta concentration in the crystal of Example 1 together with the best fit used to determine the effective distribution coefficient for Ta.

Growth of LN Crystal from Ta Containing Melt and Estimation of the Effective Ta Distribution Coefficient A crystal was grown from a melt prepared as follows: A lithium niobate growth charge was prepared by mixing and reacting lithium carbonate and niobium pentoxide the same way it is typically done to prepare for congruent LN growth. The amount of lithium carbonate was somewhat smaller than for congruent LN growth, corresponding to [Li]/[Nb]=0.938, so as to compensate for the additional Ta to be added. A small amount of Ta pentoxide was added to the reacted charge such that the melt concentration of Ta was 1000 ppm and the condition m=$m_c$ was also satisfied. This charge was then placed into a crucible, melted, and a crystal was grown using typical parameters for congruent LN growth to be manufactured into 100 mm diameter LN SAW wafers. The melt fraction converted into crystal material was 89%. No obvious growth problems were encountered, and the crystal was sliced and wafers were manufactured. Some of the polished wafer surfaces were analyzed using SIMS (Secondary Ion Mass Spectroscopy). While the absolute accuracy for this method is poor, satisfactory relative measurements can be achieved. By keeping track of the crystal location where samples were cut out, the melt fraction conversion for all the samples could be determined. The resulting values are shown in FIG. 3 as squares. Equation (3) was used to estimate the effective distribution for Ta $k_{eff}$ that best fit the measured data. The starting melt value for r was calculated from the known powder composition using the inverse relation of Equation (4). A SIMS calibration value was also fitted to get the agreement shown in FIG. 3. The effective distribution value was determined to $k_{eff}$=1.643.

Example 2

Growth of LN Crystal from Ta Containing Melt

A crystal was grown from a melt prepared as follows: A lithium niobate growth charge was prepared by mixing and reacting lithium carbonate and niobium pentoxide that was supplied by CBMM (Companhia Brasileira de Metalurgia e Mineracao), refined from ore containing pyrochlore. The pentoxide had been refined without the benefit of a liquid extraction step that would segregate out the Ta impurities, and contained about 954 ppm of Ta by weight (Refining lot AD4026). The pentoxide also contained other impurites. The measurement results (Evans Analytical Group, GDMS) are shown in Table I, second column for elements that showed levels in excess of 1 ppm.

TABLE I

| | Refining lot | |
|---|---|---|
| Impurity | AD4026 [ppm wt] | PRF 175/09 [ppm wt] |
| Na | 9.1 | 2.4 |
| Al | 1.8 | 4.2 |
| Si | 13 | 21 |
| P | 13 | 1.7 |
| Ca | 16 | 0.24 |
| Ti | 84 | 27 |
| Fe | 2.4 | 0.84 |

The resulting charge was then placed into a crucible, melted, and a crystal was grown using typical parameters for congruent LN growth to be manufactured into 100 mm diameter LN SAW wafers. The melt fraction converted into crystal material was 87%. Even though some of the impurity level of some elements (e.g. Na) were higher than what is typically used in high volume SAW wafer production, no obvious growth problems were encountered, and the crystal was sliced and SAW wafers were manufactured. In other embodiments of the invention, the niobium pentoxide source material contains a different, but significant amount of Ta impurities, typically more than 200 ppm by weight, and the amount of lithium carbonate as well as that of added Ta pentoxide is adjusted such that the grown crystal has a small deviation in values for important crystal properties, as for example the SAW velocity. In still another embodiment, there is no extra Ta pentoxide added. The amount of Ta impurities in the niobium pentoxide may be assessed and corrected for with respect to desired physical performance criteria by adjusting the ratio of weighed out powders of lithium carbonate and niobium pentoxide.

The resulting wafers were characterized by both Curie temperature measurements as well as SAW velocity measurements. The Curie temperature was measured as described in the above mentioned reference (J. Crystal Growth 310, pp. 4280-4285), with the apparatus calibrated to measure 1142.3° C. for a pure, congruent LN crystal sample. The SAW wave velocity and electro-mechanical coupling coefficient were measured on 128° RY wafers as follows. A special mask was fabricated containing various SAW devices for X-axis propagation. The devices had varying delay distances between the two transducers but otherwise identical transducer designs.

Some of the devices had the delay distance covered with metal, some were shielded from metal deposition. The parameters important for SAW performance were measured and analyzed according to the procedure outlined in the literature (R. Thomas, T. W. Johannes, W. Ruile, R. Weigel, 1998 IEEE Ultrasonics Symposium Proceedings, 277-282). By measuring the S parameters for the devices in the range from 150 MHz to 1.5 GHz, the SAW velocity can be calculated. The free velocity (no metal) shows very little dispersion, −3.6 m/s/GHz, as expected, and the zero frequency extrapolation of that data can be used as a good proxy for SAW center frequency sensitivities. For the devices with metalized delay sections, the frequency-dependent ratio of metal thickness to wavelength causes significant dispersion, requiring delay line operation at different frequencies to get precise zero frequency extrapolations. In addition to the frequency extrapolation, the effect of varying measurement temperature was also accounted for. The coupling coefficient then is calculated from the zero frequency extrapolations of the free, unmetalized surface $v_f$ and the metalized surface $v_m$ as $k^2 = 2(v_f - v_m)/v_f$. The wafers from the experimental crystal were compared to SAW wafers from standard production using Nb powders with a Ta content of less than 30 ppm. The values for these standard wafers were $v_f = 3976.39 \pm 0.09$ m/s and $k^2 = 5.416 \pm 0.006\%$. The coupling coefficient of the test wafers was determined to $5.418 \pm 0.004\%$, indistinguishable from standard production wafers. The free velocity of the test wafers is plotted in FIG. 5 together with the model prediction described in the following paragraph.

Figure 4:
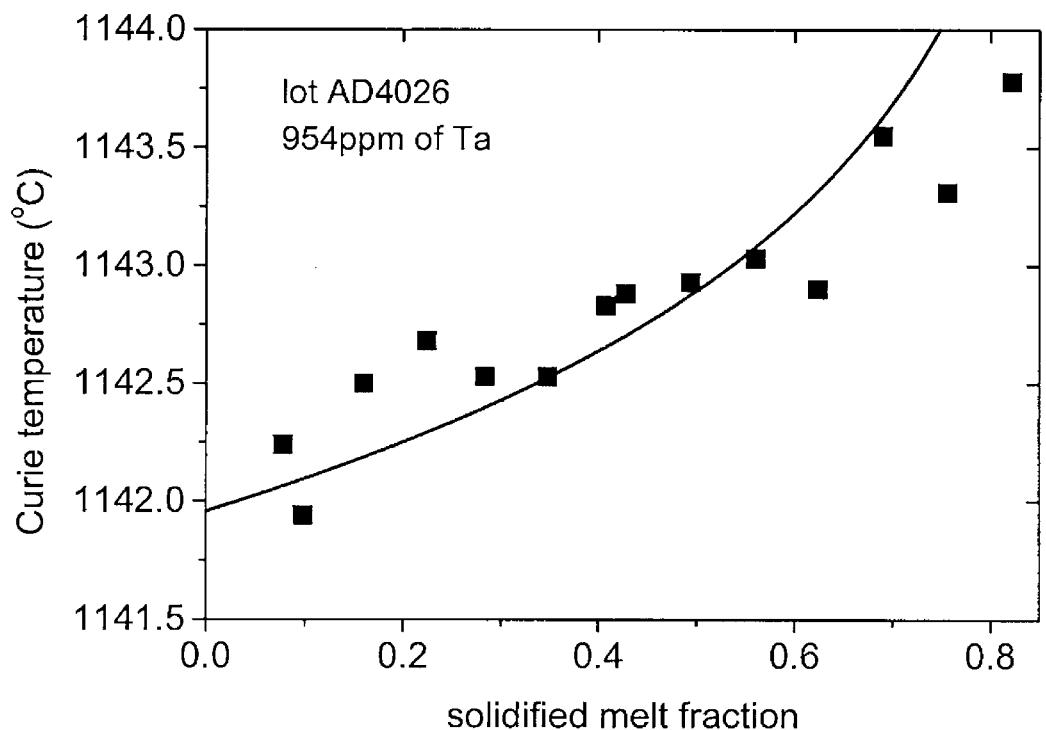
FIG. 4 is a graph that shows model predictions for the change in Curie temperature for a crystal grown from a melt produced from Nb powders containing approximately 1000 ppm of Ta. Experimentally determined values for that crystal are also shown as squares.
Figure 5:
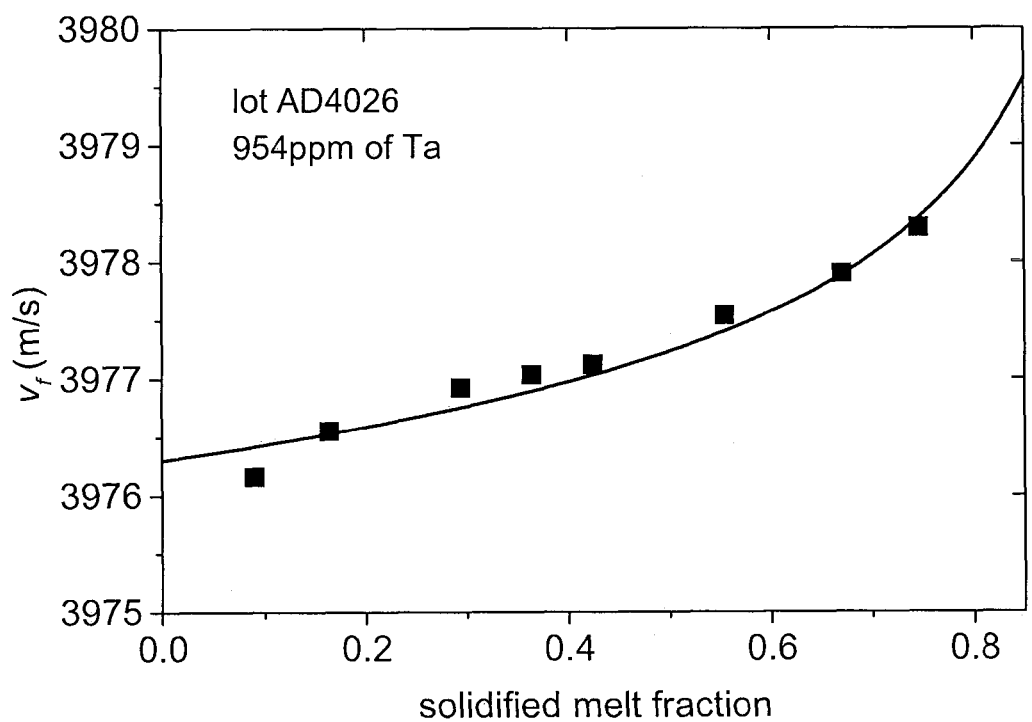
FIG. 5 is a graph that shows model predictions for the change in free SAW velocity for a crystal grown from a melt produced from Nb powders melt containing approximately 1000 ppm of Ta. Experimentally determined values for that crystal are also shown as squares.
Figure 6:
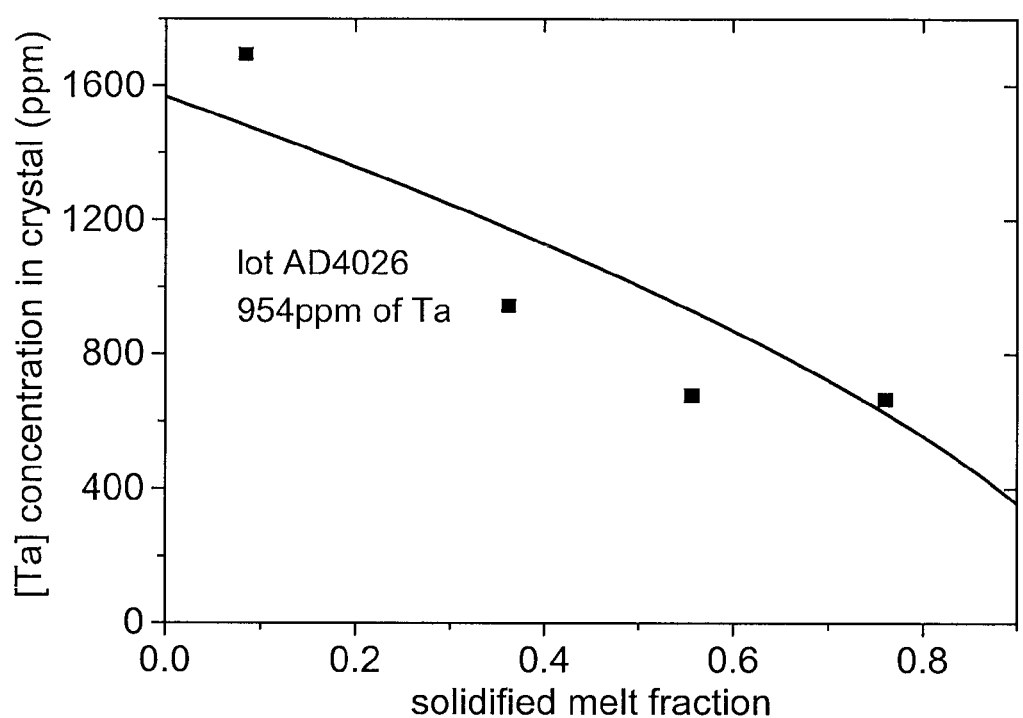
FIG. 6 shows the evolution of the axial Ta concentration along the growth axis of the crystal grown in Example 2

FIG. 4 shows the experimentally determined Curie temperature values as squares. The solid curve shows the calculation based on the estimation described above. The solid curve in FIG. 5 shows the calculation results for the free velocity. For the model calculations, the effective distribution coefficient for Ta was 1.643, the value determined FIG. 3. The initial Ta concentration in the melt is $r=0.000702$, a value corresponding to the measured Ta concentration of 954 ppm in the starting powders. The sensitivity values for the Curie temperature and free SAW velocity were based on the sensitivity analysis described above. Good agreement between the measured values and the model predictions were achieved for a starting melt composition 0.9398 and a velocity sensitivity on Ta concentration of −350 m/s. The model prediction for both the Curie temperature as well as the wave velocity agrees well with the experimental values along the crystal growth axis, represented by the solidified melt fraction. As the growth proceeds, the Ta concentration decreases as shown in FIG. 1. The Ta has the effect of decreasing the velocity as well as the Curie temperature as compared to undoped, congruent LN. The values at the top of the crystal thus are expected to be lower than that for an undoped crystal, but since the Ta concentration decreases along the growth axis, both the Curie temperature as well as the free velocity will increase as well. To test how well the predicted Ta concentration resulting from the assumed distribution coefficient for Ta (1.643) agrees with the grown crystal, SIMS was again performed on 4 samples cut from the crystal. FIG. 6 shows the agreement. The only adjustable parameter is the scale factor to derive the correct calibration. While there are uncertainties in the measurement, the overall slope of the model prediction and the measured values agrees well.

Figure 7:
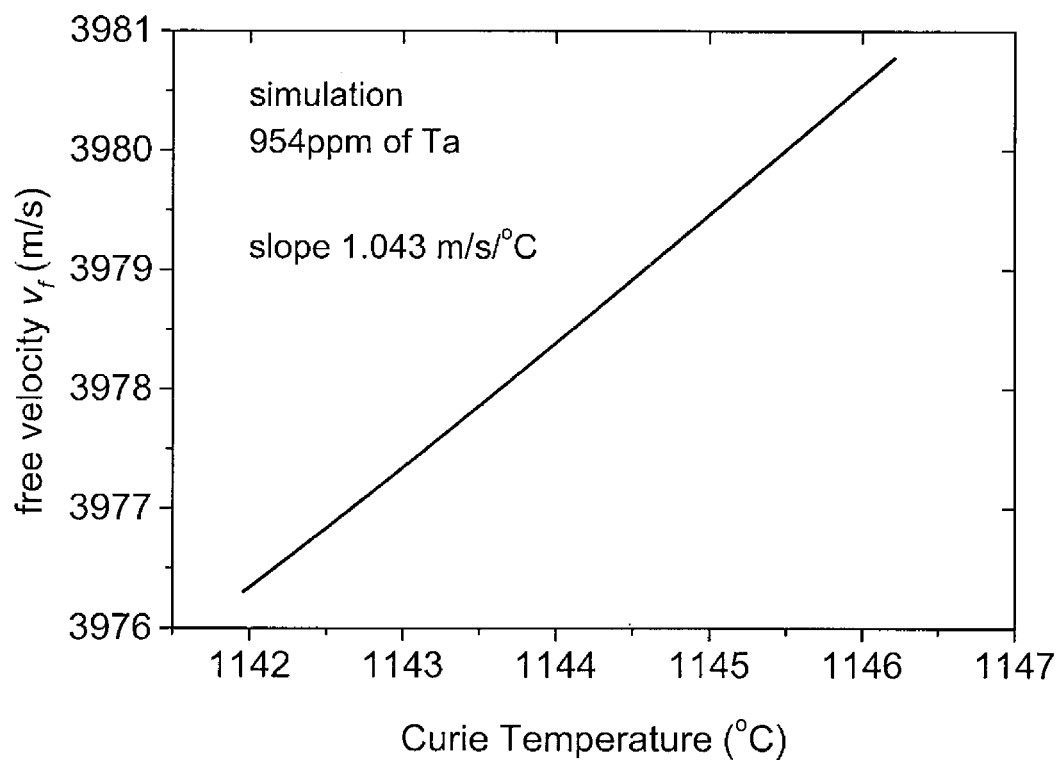
FIG. 7 is a graph that shows the growth model predictions for free SAW velocity as a function of Curie temperature.

Because the effect of a change in r and m in the crystal is different for the two crystal properties, the curves do not map exactly onto each other by a simple linear transformation. To test how well Curie measurements correlate to changes in free velocity, the predicted free velocity is plotted as a function of the predicted Curie temperature in FIG. 7. The dependence can quite accurately be described by a linear relationship having a slope of 1.04 m/s/° C. This factor is very close to that determined above assuming only deviations from congruency. It is remarkable that even though both the Curie temperature and the velocity variations are influenced by both r and m, the cumulative effect leads to variations in these figures that still allows one to be predicted based on a the measurement of the other. As mentioned above, the assumed model may not truly represent the actual system. Furthermore, there are errors in estimation of the starting melt composition as well as measurements of the material properties. It is expected that further study of the correlations will refine the model and its parameters, and future predictions may differ from those shown here. In any case, it is expected that the melt composition as defined by the parameters r>0 and m will lead to a variation of the crystal composition along its growth axis, leading in turn to variations of crystal properties along the growth axis. These variations can be minimized by deliberate adjustment of the melt starting values m simply by weighing different ratios of lithium carbonate to the pentoxide powders containing the Ta impurities. The variations across different lots of niobium pentoxide powders can be further minimized by adding a deliberate amount of Ta containing powders, e.g. in the form of Ta pentoxide, in order to achieve a consistent starting value r across all growth runs. The optimal adjustments may be arrived at by trial and error, or by using further refined models predicting how the crystal property of interest changes along the crystal axis.

Example 3

Growth of LN Crystal from Ta Containing Melt

Figure 8:
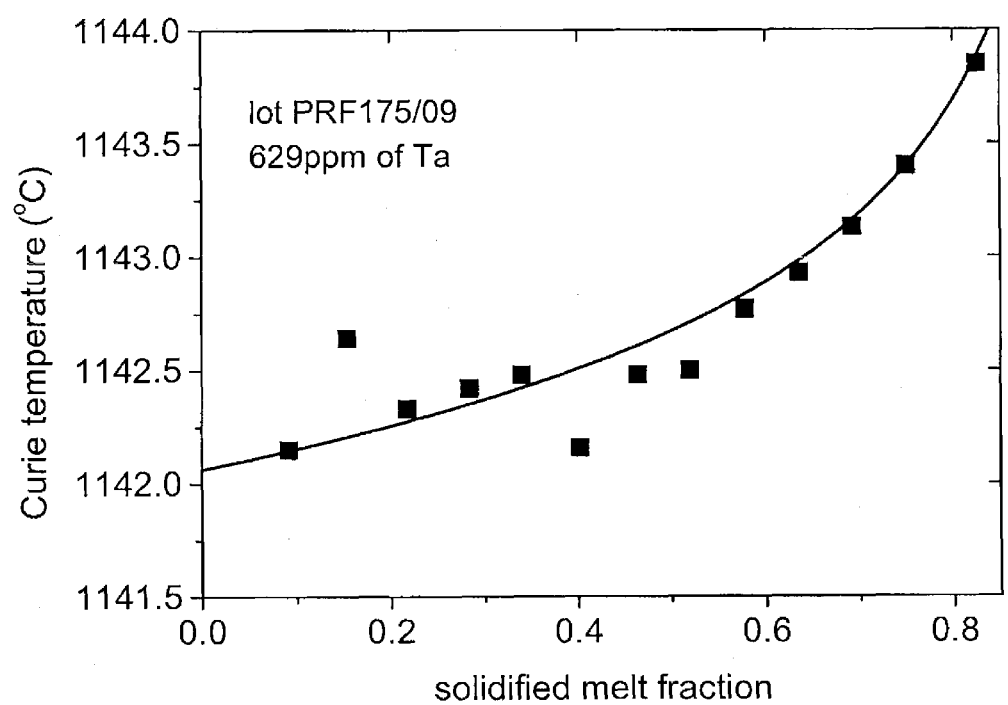
FIG. 8 is a graph that shows model predictions for the change in Curie temperature for a crystal grown from a melt produced from Nb powders melt containing approximately 630 ppm of Ta. Experimentally determined values for that crystal are also shown as squares.
Figure 9:
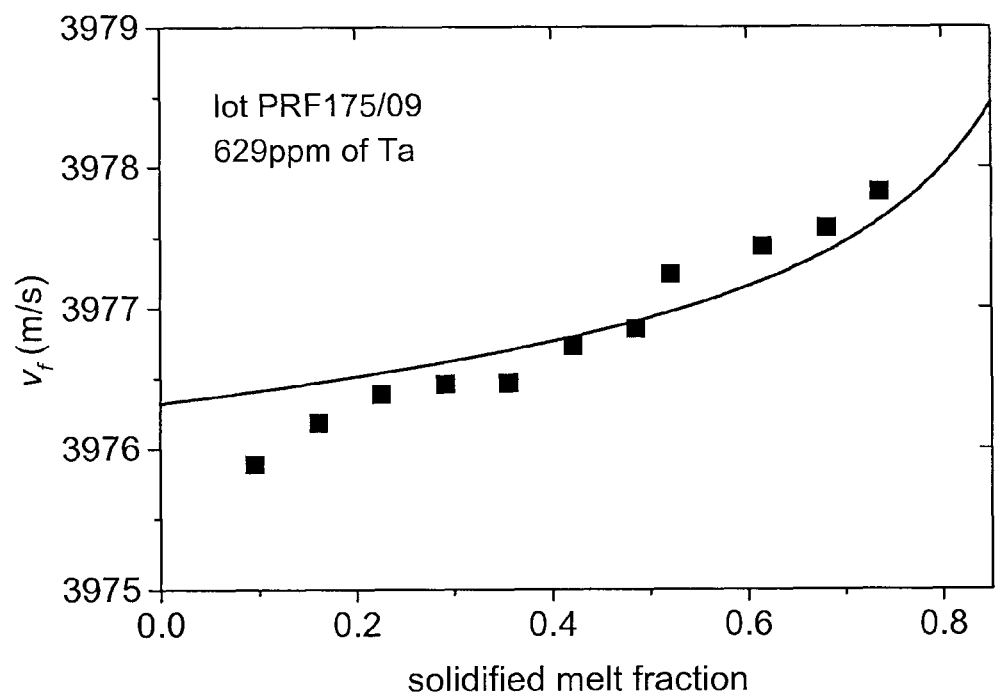
FIG. 9 is a graph that shows model predictions for the change in free SAW velocity for a crystal grown from a melt produced from Nb powders melt containing approximately 630 ppm of Ta. Experimentally determined values for that crystal are also shown as squares.

A further crystal was grown from a melt prepared as follows: A lithium niobate growth charge was prepared by mixing and reacting lithium carbonate and niobium pentoxide supplied by CBMM (Companhia Brasileira de Metalurgia e Mineração), refined from ore containing pyrochlore. The pentoxide (lot PRF 175/09) had been refined to a higher purity than the lot AD4026 used to grow the crystal of Example 2, also without the benefit of a liquid extraction step that would segregate out the Ta impurities. This lot contained about 629 ppm of Ta by weight. The pentoxide also contained other imputes, shown in Table I, third column. The resulting charge was then placed into a crucible, melted, and a crystal was grown using typical parameters for congruent LN growth to be manufactured into 100 mm diameter LN SAW wafers. The melt fraction converted into crystal material was 88%. Wafer fabrication, Curie temperature and SAW velocity characterization proceeded in the same manner as for Example 2. The coupling coefficient was determined to $5.416 \pm 0.003\%$ in excellent agreement with the values for both the undoped wafers and the wafers of Example 1 that had slightly higher Ta content. The experimental results together with the model predictions are shown in FIGS. 8 and 9. Again, good agreement is achieved. For the simulation, all values were kept the same as those used in the simulation for Example 2 except for a change of r to account for the lower impurity concentration and choosing a the starting composition m=0.9389 for the model calculation. The equivalent slope to that in FIG. 7 again was calculated and yielded the identical value 1.043.

The current model predictions for melts with starting compositions near congruency (m.apprxeq.m.sub.c) as those for the experimental examples above show a free SAW velocity variation that changes in step with the Curie temperature with a correlation factor of 1.04 m/s/.degree. C. This was shown for starting powder impurity contents up to 1000 ppm of Ta and a melt conversion of 90%. As long as the Ta concentration is stable in the starting powders, controlling the Curie temperature within a specification window from top wafer to bottom wafer as well as between different crystals will guarantee that the free velocity also is controlled within a window with size given by the correlation factor. The experimental results can be extrapolated to 2000 ppm of Ta content by weight in the niobium pentoxide starting powders, keeping the initial melt composition m similar to that in the example growths, one can expect a change of 3.3.degree. C. for Curie temperature, and a 3.4 m/s change in free SAW velocity. This is still well within typical SAW wafer specifications of Curie temperature variations of .+−0.3.degree. C. around the nominal value (IEC standard 62276, Single crystal wafers for surface acoustic wave (SAW) device applications—Specifications and measuring methods), and the corresponding expected window in SAW velocity of 6.6 m/s. Both model and experiments thus predict that wafers produced from niobium pentoxide powders with equal or less than 2000 ppm of Ta in weight can be controlled to fall within typical customer specifications for SAW wafers. For some high performance SAW filters, a tightened Curie temperature specification window equal to or narrower than .+−0.2.degree. C. may apply (1.86.degree. C. for US2009/0235500A1 or 1.90.degree. C.). If the variation within that specification window is due to a combination of varying m and r values as assumed here, one can estimate that the velocity variation in the wafer population is less than 1.04.times.2 m/s=2.1 m/s. This variation in the performance critical parameter for the SAW filter maker is even lower than if the change were caused by congruency variation alone (1.1.times.2 m/s=2.2 m/s). Therefore, it is sufficient to control the Curie temperature to .+−0.2.degree. C., even for crystals grown from melts containing significant amounts of Ta impurities, in order to achieve the narrow velocity distribution necessary for high performance filters.

Figure 10:
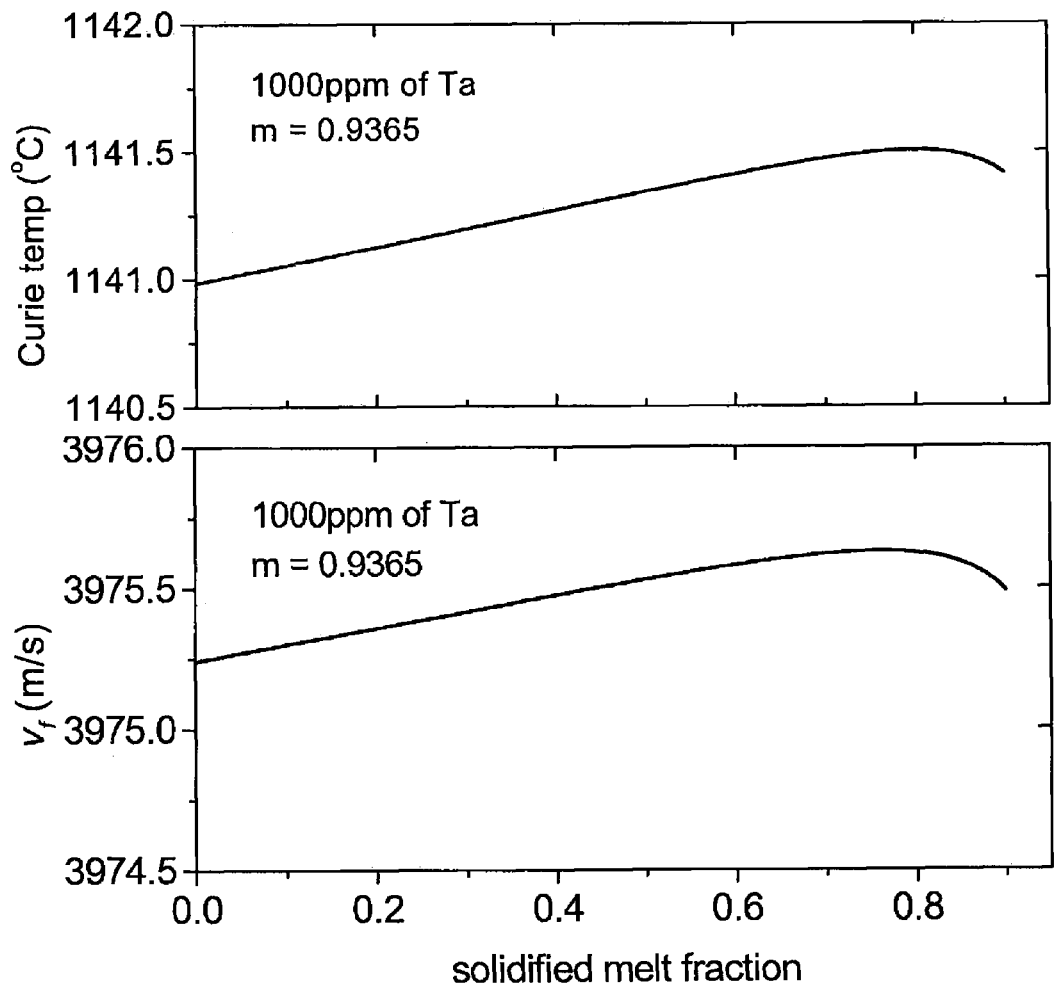
FIG. 10 is a graph that shows the expected variation of the Curie temperature and SAW velocity along the grown crystal axis for a growth with 1000 ppm of Ta in the starting powder and a lowered Li concentration as compared to congruency.

The model also suggests that by adjusting the starting composition m, it is possible to further decrease the impact of the Ta gradients grown into the crystal on the variation of the free SAW velocity. The value of m can easily be adjusted simply by changing the proportion of lithium carbonate to niobium pentoxide powder used for the charge preparation. In particular, a value $m<m_c$ is advantageous. The Li-poor starting melt will also result in a somewhat Li-poorer crystal. As the Li in the melt is preferentially incorporated, the crystal will have a decreasing Li content along its growth axis. This gradient will have the opposite effect on the Curie temperature as well as on the SAW velocity than does the decreasing Ta concentration gradient. By choosing the appropriate m value for the powder mixture (given a well defined Ta concentration), it then is possible to minimize the variation of the physical characteristics along the grown crystal axis. FIG. 10 shows a simulation with a Ta powder concentration of 1000 ppm and a (lower than congruency) m value of 0.9365. Both the lower m value and the Ta content will have the effect of lowering the Curie temperature as well as the velocity from the congruent, undoped crystal. This shift can be accounted for by a slightly re-designed mask for SAW filter manufacturing. It is common practice for high performance SAW filters to require a mask redesign if for example the wafer crystal manufacturer is changed. It can be seen from FIG. 10 that the variation of both the Curie temperature and the velocity along the crystal axis is quite small, 0.52° C. and 0.386 m/s respectively. The linear correlation between the two figures still holds, but the correlation coefficient is lowered to 0.75 m/s/° C. As long as the manufacturer controls the Curie temperature within a given window, the variability in the velocity is even smaller than for the customary case where congruency variations are the dominant factor affecting the SAW properties.

While the invention has been described and illustrated with reference to certain particular embodiments thereof, those skilled in the art will appreciate that various adaptations, changes, modifications, substitutions, deletions, or additions of procedures and protocols may be made without departing from the spirit and scope of the invention. For example, the effective distribution coefficient for Ta incorporation may be different from that assumed. Similarly, the particular effect of Ta incorporation on the Li/Nb segregation may be different from that assumed. It remains the case that these relationships exist and govern the composition of the growing crystal for a given melt composition and impurity content. By controlling the value of both r and m in the starting melt, crystals with low gradients in free SAW velocity and coupling coefficients can be grown for a wide range of Ta impurity concentrations in the pentoxide starting powder.

What is claimed is:

1. A lithium niobate substrate, comprising:
a substrate having 87% to 90% fraction of crystal converted from a melt with a niobium pentoxide source material in presence of 200 ppm-2000 ppm by weight of Ta metal impurities in starting composition of the melt, wherein the crystal in the substrate has a Curie temperature controlled within a window of ±3° C.

2. The lithium niobate substrate of claim 1, wherein the Curie temperature of the crystal is controlled within a window of ±2° C.

3. A lithium niobate substrate, comprising:
a substrate having 87% to 90% fraction of crystal converted from a melt with a niobium pentoxide source material in presence of 200 ppm-2000 ppm by weight of Ta metal impurities in starting composition of the melt, wherein the crystal in the substrate has a surface acoustic wave velocity controlled within a window of ±3.3 m/s.

4. The lithium niobate substrate of claim 3, wherein the surface acoustic wave velocity of the crystal is controlled within a window of ±2.2 m/s.

5. A lithium niobate substrate, comprising:
a substrate having 87% to 90% fraction of crystal converted from a melt with a niobium pentoxide source material in presence of 200 ppm-1000 ppm by weight of Ta metal impurities in starting composition of the melt, wherein the crystal in the substrate has a Curie temperature controlled within a window of ±3° C.

6. The lithium niobate substrate of claim 5, wherein the Curie temperature of the crystal is controlled within a window of ±2° C.

7. A lithium niobate substrate, comprising:
a substrate having 87% to 90% fraction of crystal converted from a melt with a niobium pentoxide source material in presence of 200 ppm-1000 ppm by weight of Ta metal impurities in starting composition of the melt, wherein the crystal in the substrate has a surface acoustic wave velocity controlled within a window of ±3.3 m/s.

8. The lithium niobate substrate of claim 7, wherein the surface acoustic wave velocity of the crystal is controlled within a window of ±2.2 m/s.

* * * * *